US012592673B2

(12) United States Patent
Bettencourt et al.

(10) Patent No.: US 12,592,673 B2
(45) Date of Patent: Mar. 31, 2026

(54) OFF-STATE ISOLATION BIAS CIRCUIT FOR D-MODE AMPLIFIERS

(71) Applicant: Raytheon Company, Waltham, MA (US)

(72) Inventors: John P. Bettencourt, Boxford, MA (US); Joseph Peter Davis, Andover, MA (US); John C. Tremblay, Lancaster, MA (US)

(73) Assignee: Raytheon Company, Arlington, VA (US)

( * ) Notice: Subject to any disclaimer, the term of this patent is extended or adjusted under 35 U.S.C. 154(b) by 489 days.

(21) Appl. No.: 18/185,837

(22) Filed: Mar. 17, 2023

(65) Prior Publication Data
US 2024/0313715 A1    Sep. 19, 2024

(51) Int. Cl.
*H03F 3/217*        (2006.01)
*H03F 1/26*        (2006.01)

(52) U.S. Cl.
CPC ............. *H03F 3/2171* (2013.01); *H03F 1/26* (2013.01); *H03F 2200/451* (2013.01)

(58) Field of Classification Search
CPC ..... H03F 3/2171; H03F 1/26; H03F 2200/451
USPC ........................................................ 330/251
See application file for complete search history.

(56) References Cited

U.S. PATENT DOCUMENTS

| | | | | |
|---|---|---|---|---|
| 4,637,073 A | * | 1/1987 | Selin | G01S 7/034 330/134 |
| 4,896,121 A | | 1/1990 | Larson | |

| | | | | |
|---|---|---|---|---|
| 5,793,194 A | | 8/1998 | Lewis | |
| 5,889,429 A | | 3/1999 | Kobayashi et al. | |
| 5,900,756 A | * | 5/1999 | Drouot | G11C 29/84 327/437 |
| 6,114,901 A | | 9/2000 | Singh et al. | |
| 6,304,130 B1 | | 10/2001 | Poulin et al. | |
| 7,852,136 B2 | | 12/2010 | Bettencourt | |
| 7,928,804 B2 | | 4/2011 | Yamamoto et al. | |
| 8,319,560 B2 | * | 11/2012 | Kocer | H03F 3/24 330/296 |
| 8,854,140 B2 | | 10/2014 | Bettencourt et al. | |

(Continued)

FOREIGN PATENT DOCUMENTS

GB        2161046 A        1/1986

OTHER PUBLICATIONS

Bias Circuits for RF Devices, Iulian Rosu, YO3DAC / VA3IUL, http://www.qsl.net/va3iul (Year: 2015).*

(Continued)

*Primary Examiner* — Hafizur Rahman

(57)        ABSTRACT

A circuit comprises an amplifier and a bias circuit. The amplifier comprises an output transistor comprising a source electrode, a drain electrode, and a gate electrode. The bias circuit comprises: a first control loop configured to set a first quiescent bias for the output transistor based on a first value of a first control voltage and a second value of a second control voltage, wherein the first quiescent bias is configured to put the output transistor in an on state; and a second control loop configured to set a second quiescent bias for the output transistor based on the first value of the first control voltage and the second value of the second control voltage. The second quiescent bias is configured to put the output transistor in an off state and to increase an insertion loss of the amplifier when the output transistor is in the off state.

20 Claims, 9 Drawing Sheets

(56)　　　　　References Cited

U.S. PATENT DOCUMENTS

| | | | |
|---|---|---|---|
| 9,520,836 | B1 | 12/2016 | Kaper |
| 9,584,072 | B1 | 2/2017 | Kaper |
| 9,634,613 | B1 | 4/2017 | Watters et al. |
| 9,960,740 | B2 | 5/2018 | Bettencourt et al. |
| 10,277,176 | B2 | 4/2019 | Bettencourt et al. |
| 10,447,208 | B2 | 10/2019 | Bettencourt et al. |
| 11,476,154 | B2 | 10/2022 | LaRoche et al. |
| 2003/0193368 | A1 | 10/2003 | Jackson |
| 2007/0125414 | A1 | 6/2007 | Bettencourt |
| 2009/0296855 | A1* | 12/2009 | Kitamura .............. H03F 1/0261 |
| | | | 375/297 |
| 2014/0065984 | A1* | 3/2014 | Wang ....................... H04B 1/48 |
| | | | 455/78 |

OTHER PUBLICATIONS

Office Action dated Oct. 23, 2024 in connection with Taiwanese Patent Application No. 113100713, 18 pages.

International Search Report and Written Opinion of the International Searching Authority dated Apr. 19, 2024 in connection with International Patent Application No. PCT/US2024/010368, 16 pages.

Hietanen et al., "Ka-Band TDD Front-End with Gate Shunt Switched Cascade LNA and Three-Stack PA on 22nm FDSOI CMOS Technology," 50th European Microwave Conference (EuMC), Jan. 2021, 4 pages.

U.S. Appl. No. 17/646,162, filed Dec. 28, 2021, Bettencourt et al.

Gray et al., *Analysis and Design of Analog Integrated Circuits*, Fourth Edition Book; New York, John Wiley & Sons, Inc.; Jan. 2001; 445 Pages (Part 1 of 5).

Gray et al., *Analysis and Design of Analog Integrated Circuits*, Fourth Edition Book; New York, John Wiley & Sons, Inc.; Jan. 2001; 100 Pages (Part 2 of 5).

Gray et al., *Analysis and Design of Analog Integrated Circuits*, Fourth Edition Book; New York, John Wiley & Sons, Inc.; Jan. 2001; 100 Pages (Part 3 of 5).

Gray et al., *Analysis and Design of Analog Integrated Circuits*, Fourth Edition Book; New York, John Wiley & Sons, Inc.; Jan. 2001; 100 Pages (Part 4 of 5).

Gray et al., *Analysis and Design of Analog Integrated Circuits*, Fourth Edition Book; New York, John Wiley & Sons, Inc.; Jan. 2001; 144 Pages (Part 5 of 5).

Scheinberg, "High-Speed GaAs Operational Amplifier;" Proceedings of IEEE Journal of Solid-State Circuits, vol. SC-22, No. 4; Aug. 1987; 6 Pages.

* cited by examiner

300

Simplified TR System Front End
Element when LNA is Enabled

Simplified TR System Front End
Element when LNA is Enabled-
Improving Off State Amp Insertion Loss Improved Off-State
Insertion Loss

| State | VD LNA | VD PA |
|-------|--------|-------|
| Receive | Hi | Lo |
| Transmit | Lo | Hi |
| STBY* | Lo | Lo |

OFF-STATE ISOLATION BIAS CIRCUIT FOR D-MODE AMPLIFIERS

FIELD

Embodiments of the disclosure generally relate to devices, systems, and methods for providing circuits for bias control of radio frequency (RF amplifiers).

BACKGROUND

FIG. 1 is a first circuit diagram 100 of a prior art amplifier, here a radio frequency (RF) amplifier comprising: a depletion mode transistor Q1 having a source electrode coupled to a reference potential, here ground; a drain electrode coupled to a potential more positive than the reference potential, here (+Vdd) through a first inductor, as shown, the drain electrode providing an amplified RF output after passing through a first capacitor as shown; and a gate electrode for coupling to an input signal, here an RF input through a second capacitor, as shown. It is noted that the source electrode of the transistor Q is connected to ground, as shown and there is a second inductor in between gate of Q1 and the gate voltage Vg.

Setting this quiescent drain current (Id) for the Field Effect Transistor (FET) type amplifier as shown in FIG. 1, is usually accomplished by adjusting the DC gate voltage Vg supplied to the gate of the transistor (Q1), e.g., via a bias circuit/network (as is known, bias networks/circuits are used to put a FET at the intended quiescent operating point). Although in principle the gate voltage Vg can be determined readily from the quiescent drain current Id versus gate voltage Vg transfer characteristic of a typical device, inherent sensitivities of the FET characteristics to fabrication process and temperature preclude use of a fixed Vg.

In analog circuit designs, there are various ways to bias a FET amplifier to get to the intended quiescent operating point. For example, one technique for biasing a first FET is via an active bias circuit/network, such as a current mirror circuit. An active bias circuit/network is an analog circuit that uses a second FET to help "calculate" required gate bias for the first FET to be biased and then the second FET supplies the required gate bias to the first FET (which corresponds to the active device in the amplifier). This arrangement removes a need for manual adjustments to the first FET's Q-point but does require a negative supply voltage. For example, current mirror circuits may be used as an active bias circuit/network. An example of a current mirror used for DC biasing of a PET is described in a book by Paul R. Gray and Robert G. Meyer, entitled Analysis and Design of Analog Integrated Circuits. 3$^{rd}$ ed., New York: Wiley. 1993, which is hereby incorporated by reference.

FG. 2 is a second circuit diagram 200 showing a schematic representation of a prior art current mirror configuration for depletion mode Gallium Arsenide Metal Semiconductor Field Effect Transistor (D-mode GaAs MESFET) operational amplifiers, similar to that demonstrated by Scheinberg, see N Scheinberg. Design of high speed operational amplifiers with GaAs MESFETs, procs 1987 IEEE ISCAS (Philadelphia) May 1987, pp 193-198 and C. Tamazou and D. Haigh, "Gallium Arsenide Analog Integrated Circuit Design Techniques," Chapter 8 in "Analogue IC design: the current-mode approach", Edited by C. Tamazou, F. J. Lidgey & D. G. Haigh. London: Peter Peregrinus Ltd. 1990, which are each incorporated by reference.

The second circuit diagram 200 of FIG. 2 shows a bias circuit, comprising: a current mirror having: a current source Iref, and biasing circuitry (depletion mode transistors Q1, Q3, and Q4 and first diode 220 and second diode 222) arranged as shown, coupled to the current source Iref 204, and between the potential more positive than the reference potential (+Vdd) and a potential more negative than the reference potential (Vss1 which corresponds to a more negative potential of Vss). The first diode 220 and second diode 222 in this example are Gallium Arsenide (GaAs) diodes. It should be noted that although the second circuit diagram 200 shows only a first diode 220 and a second diode 222, there can be a plurality of GaAs diodes, e.g., n diodes, where n is the number of diodes in the series selected in accordance with the voltages used in a given circuit. In the example of FIG. 2, +Vdd is 24 volts and Vss1 is −8.0 volts. The circuit of FIG. 2 can be easily implemented for controlling drain current in a high efficiency, high powered RF amplifier.

FIG. 3 is a third circuit diagram of a prior art amplifier and current mirror configuration, which shows a simplified schematic implementation with appropriate inductors and capacitors connected to an RF amplifier having the FET Q2. A necessity for high power and high efficiency RF amplifiers is that the FET source potentials need to be tied directly to ground reference, also depicted in FIG. 3 by showing Vss tied to ground potential. Also note that Vss1 is more negative than ground potential where the drains of Q1, Q2 and Q3 are more positive than ground potential. The arrangement and function of first diode 310 and second diode 312 is similar to that of the first diode 220 and second diode 222 of FIG. 2 and is not repeated here.

With circuits such as those of FIGS. 1 and 2, in the absence of a bias circuit that compensates for process variations, some means for adjusting the gate voltage Vg preferably on a per amplifier basis may be implemented to ensure that quiescent drain current Id is set near the nominal target value. Examples of patents for these types of circuits are: U.S. Pat. Nos. 5,889,429; 6,304,130; 6,114,901; 5,793, 194; 4,896,121; 7,928,804, 8,854,140, all of which are incorporated herein by reference.

SUMMARY

The following presents a simplified summary in order to provide a basic understanding of one or more aspects of the embodiments described herein. This summary is not an extensive overview of all of the possible embodiments and is neither intended to identify key or critical elements of the embodiments, nor to delineate the scope thereof. Rather, the primary purpose of the summary is to present some concepts of the embodiments described herein in a simplified form as a prelude to the more detailed description that is presented later.

One general aspect includes a circuit that comprises a first amplifier comprising a first output transistor, the first output transistor comprising a first source electrode, a first drain electrode, and a first gate electrode; and a bias circuit in operable communication with the first amplifier, the bias circuit comprising: a first control loop configured to set a first quiescent bias for the first output transistor based on a first value of a first control voltage and a second value of a second control voltage, wherein the first quiescent bias is configured to put the first output transistor in an on state; and a second control loop configured to set a second quiescent bias for the first output transistor based on the first value of the first control voltage and the second value of the second control voltage, wherein the second quiescent bias is configured to put the first output transistor in an off state and to increase an insertion loss of the first amplifier when the first output transistor is in the off state.

In some embodiments, the bias circuit provides a first output signal to the first gate electrode, the first output signal based on at least one of the first control loop and the second control loop. In some embodiments, at least one of the first control loop and the second control loop further comprises a first level shifting network configured to provide first level shifting in a level of the first output signal. In some embodiments, the first level shifting network comprises at least one of a diode, a resistor, and a short circuit connection. In some embodiments, the circuit further comprising a second level shifting network configured to be shared by both the first control loop and the second control loop, the second level shifting network configured to provide second level shifting in a level of the first output signal. In some embodiments, the second level shifting network comprises at least one of a diode, a resistor, and a short circuit connection.

In some embodiments, the second quiescent bias is configured to: set a voltage at the first gate electrode to a value that is positive relative to a pinch-off voltage of the first output transistor; and form a resistance between the first drain electrode and the first source electrode that is low enough to enable conduction to ground between the first drain electrode and the first source electrode. In some embodiments, one of the first and second control voltages is coupled to the first drain electrode of the first amplifier. In some embodiments, if the first control voltage is at a logic high level and the second control voltage is at a logic low level, the first control loop is configured to set the first quiescent bias to put the first output transistor in the on state. In some embodiments, if the first control voltage is at a logic low level and the second control voltage is at a logic high level, the second control loop is configured to set the second quiescent bias to put the first output transistor in the off state. In some embodiments, at least one of the first control loop and the second control loop further comprises a diode network comprising at least one diode, wherein the diode network is configured to isolate at least a portion of the first control loop from the second control loop.

In some embodiments the bias circuit further comprises a second amplifier comprising a second output transistor, the second output transistor comprising a second source electrode, a second drain electrode, and a second gate electrode, wherein the bias circuit is in operable communication with the second amplifier, wherein the first control loop is configured to set a third quiescent bias for the second output transistor based on the first value of a first control voltage and the second value of a second control voltage, wherein the third quiescent bias is configured to put the second output transistor in an off state and to increase an insertion loss of the second amplifier when the second output transistor is in the off state; and the second control loop configured to set a fourth quiescent bias for the second output transistor based on the first value of the first control voltage and the second value of the second control voltage, wherein the fourth quiescent bias is configured to put the second output transistor in an on state.

In some embodiments, the first control loop and the second control loop are configured so that if the first control voltage is at a logic high level and the second control voltage is at a logic low level, the first control loop is configured to set the first quiescent bias to put the first output transistor in the on state, and is configured to set the third quiescent bias to put the second output transistor in the off state. In some embodiments, the first control loop and the second control loop are configured so that if the first control voltage is at a logic low level and the second control voltage is at a logic high level, the second control loop is configured to set the first quiescent bias to put the first output transistor in the off state, and is configured to set the fourth quiescent bias to put the second output transistor in the on state. In some embodiments, the bias circuit provides a second output signal to the second gate electrode, the second output signal based on at least one of the first control loop and the second control loop.

In some embodiments, the bias circuit comprises a third control loop configured to set a third quiescent bias for the first output transistor based on the first value of the first control voltage, the second value of the second control voltage, and a third value of a third control voltage, wherein the third quiescent bias is configured to put the first output transistor in one of an on state and an off state. In some embodiments, at least one of the first control loop and the second control loop comprises a plurality of control loops. In some embodiments, at least one of the first control voltage and the second control voltage is associated with a range of voltage values.

One general aspect includes a method that comprises providing a first amplifier comprising a first output transistor, the first output transistor comprising a first source electrode, a first drain electrode, and a first gate electrode; operably coupling a bias circuit to the first amplifier, the bias circuit comprising: a first control loop configured to set a first quiescent bias for the first output transistor based on a first value of a first control voltage and a second value of a second control voltage, wherein the first quiescent bias is configured to put the first output transistor in an on state; and a second control loop configured to set a second quiescent bias for the first output transistor based on the first value of the first control voltage and the second value of the second control voltage, wherein the second quiescent bias is configured to put the first output transistor in an off state and to increase an insertion loss of the first amplifier when the first output transistor is in the off state. The method also comprises providing a first output signal to the first gate electrode, the first output signal based on at least one of the first control loop and the second control loop.

In some embodiments, the method further comprising: setting a voltage at the first gate electrode to a value that is positive relative to a pinch-off voltage of the first output transistor; and forming a resistance between the first drain electrode and the first source electrode that is low enough to enable conduction to ground between the first drain electrode and the first source electrode.

It should be appreciated that individual elements of different embodiments described herein may be combined to form other embodiments not specifically set forth above. Various elements, which are described in the context of a single embodiment, may also be provided separately or in any suitable sub-combination. It should also be appreciated that other embodiments not specifically described herein are also within the scope of the claims included herein.

Details relating to these and other embodiments are described more fully herein.

BRIEF DESCRIPTION OF THE DRAWINGS

The advantages and aspects of the described embodiments, as well as the embodiments themselves, will be more fully understood in conjunction with the following detailed description and accompanying drawings, in which.

The drawings are not intended to be to scale. Also, in the drawings, like reference numbers indicate like elements.

DETAILED DESCRIPTION

Figure 1:
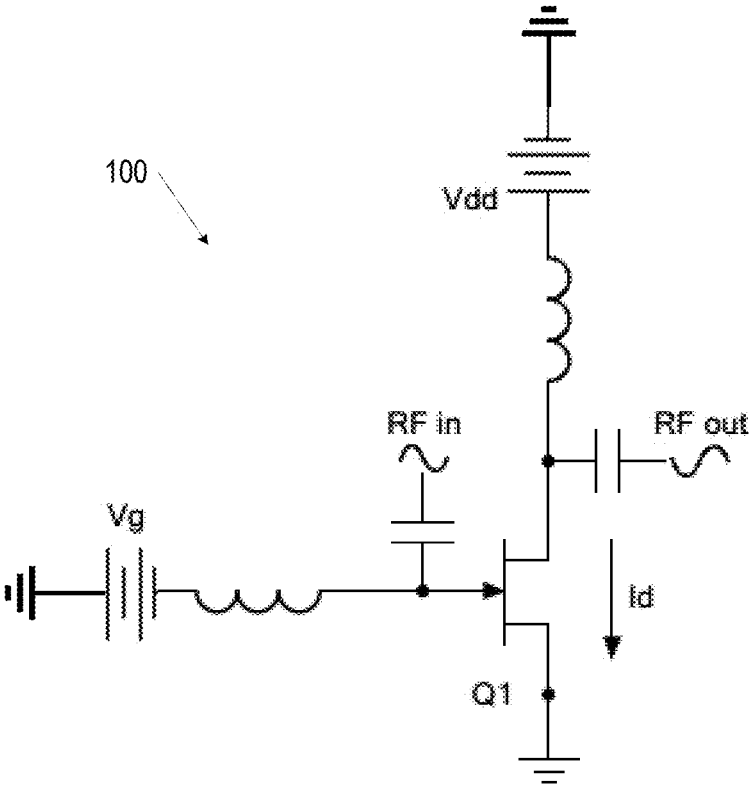
FIG. 1 is a first simplified circuit diagram of a prior art amplifier.

The following detailed description is provided, in at least some examples, using the specific context of use in the front end of a radar system, but the embodiments described herein are applicable to any system, circuit, or device where biasing of transistors in amplifiers is required, as well as any systems that could be subject to unwanted coupling and/or other types of signal interference. The embodiments described herein also have applicability to multiple semiconductor technologies (e.g., including but not limited to Gallium Arsenide (GaAs), Gallium Nitride (GaN), Silicon Carbide (SiC), etc.).

Various connections and couplings are set forth between elements in the following description and in the drawings. These connections in general and, unless specified otherwise, may be direct or indirect and this specification is not intended to be limiting in this respect. Any component or element herein can be formed as processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

Additionally, use of the term "signal" in conjunction with this disclosure is not limited to analog and/or digital signals but rather is meant to denote as well (1) the mathematical description of any measurable phenomena in nature or in human-made systems and (2) the mathematically described function of one or more variable depending on one or more parameters. Examples of types of signals which are encompassed in the embodiments described herein include, but are not limited to, light intensity, voltage, pressure, electromagnetic radiation (including radio waves), magnetic field strength and electric field strength.

RF amplifiers are used in many applications, such as in the front ends of radar systems, which may include transmit/receive (TR) amplifier elements that amplify signals going to radiating elements in an antenna. This is depicted graphically in FIG. 4, which is a fourth simplified circuit diagram of a first system front end first TR element 400 when a low noise amplifier (LNA) 406 is enabled, in accordance with one embodiment. The TR system front end first TR element 400 includes a TX/RX connection 402, which couples to a radar receiver (not shown) and a radar transmitter (not shown). The TX/RX connection 402 is also coupled to a switch 410 that is configured to switch the TX/RX connection either to the receive path 411 or the transmit path 413.

Figure 4:
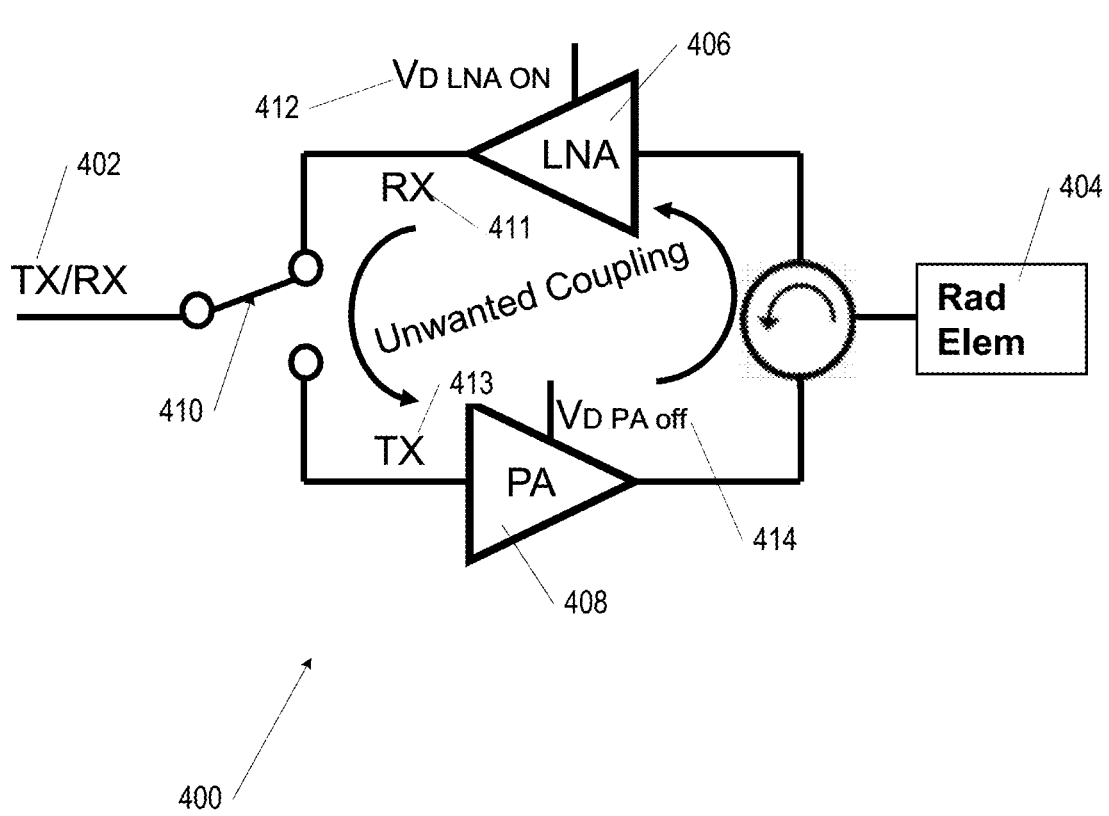
FIG. 4 is a fourth simplified circuit diagram of a prior art first transmit/receive (TR) front end element when a low noise amplifier (LNA) is enabled, in accordance with one embodiment.

When the switch 410 is set to the receive path 411 (e.g., as shown in FIG. 4), RF signals (e.g., returns from a target) are picked up at one or more radiating elements 404 of an antenna array, and these received signals are amplified by LNA 406 and provided to a receiver (not shown) as is well understood in the art. When the switch 410 is set to the transmit path 413, a signal from a transmitter (not shown) is coupled to the power amplifier (PA) 408 and then provided to the one or more radiating elements 404, for transmission.

Figure 2:
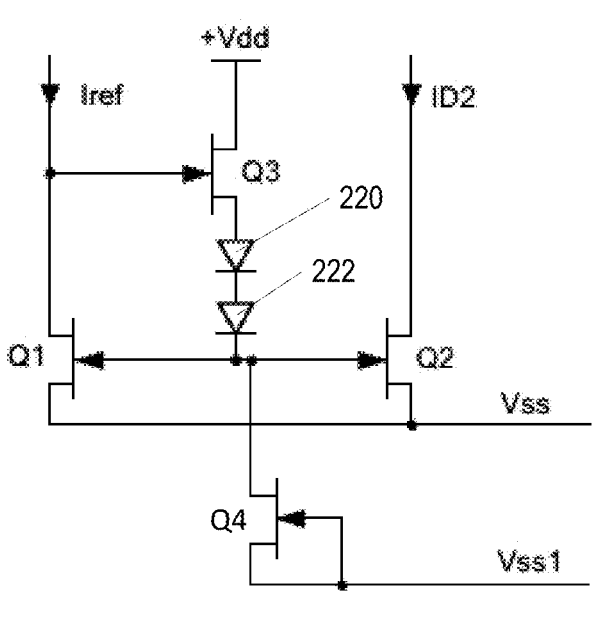
FIG. 2 is a second simplified circuit diagram of a prior art current mirror configuration.
Figure 3:
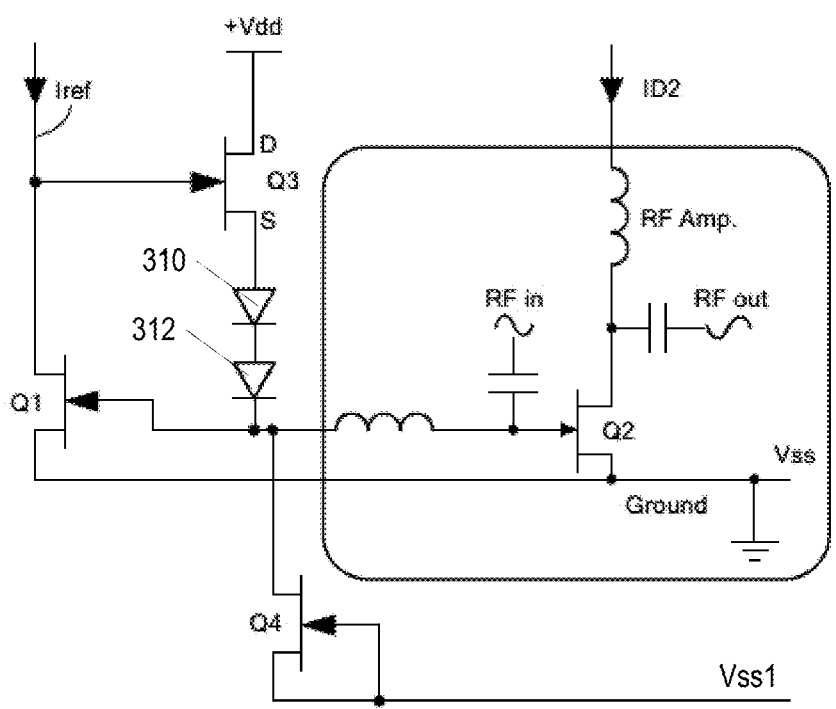
FIG. 3 is a third simplified circuit diagram of a prior art amplifier and current mirror configuration.

The LNA 406 in the first TR element 400 of FIG. 4 is a FET amplifier type of circuit, similar to that of FIG. 1 which was described previously, and the VD LNA ON signal 412, in the circuit of FIG. 4, provides a drain voltage level (e.g., +VDD 102 of FIG. 1) that is configured to cause the FET Q1 120 of FIG. 1 to be in an "ON" state, as shown in FIG. 4, will be understood. The PA 408 of FIG. 4 is also a FET amplifier circuit, similar to that of FIG. 2, which was described previously, and the VD PA off signal 414, in the circuit of FIG. 4, is set so that the PA is off (since the transmit path 413 (TX path) is not selected). In addition, as will be appreciated, during operation of the circuit of FIG. 4, the switching between transmit and receive is very rapid.

During operation of the first TR element 400 of FIG. 4, however, there can be undesired effects. For example, as depicted in FIG. 4, unwanted coupling can occur between off-state and on-state TR amplifier elements (e.g., unwanted coupling between LNA 406 and PA 408 when one of the two types of amplifiers is on and the other one is off). Various factors can drive this effect, including but not limited to higher gain of the amplifiers, operational frequency, and tight spacing of circuitry. This coupling can cause gain ripple, phase ripple or oscillations, which can impact operation and/or accuracy of the circuit and/or any systems in which the circuit is installed.

One method for mitigating unwanted coupling is increasing the insertion loss of the off-state amplifiers. In one embodiment herein, an RF amplifier bias circuit is provided that is configured to provide increased insertion loss of the off-state amplifiers and is further configured to provide two different bias control loops to help to mitigate the unwanted coupling. That is, in certain embodiments, the insertion loss when the amplifier is in the "off" state is increased as compared to use of prior art RF amplifier bias circuits. In certain embodiments, the insertion loss when the amplifier is in the "off" state is increased as compared to when the amplifier is in the "on" state. Although in some circuit environments, it is preferable to keep insertion loss low, by having increased insertion loss in the "off" state of an amplifier, as described herein, it is possible to mitigate unwanted coupling in the circuit environment.

The RF amplifier bias circuit provided herein (discussed further herein in connection with FIGS. 5-8, especially FIGS. 7 and 8, which illustrate two embodiments of a bias circuit) provides a first control loop establishing a first quiescent bias for the on-state of an LNA amplifier and a second control loop establishing a second quiescent bias establishing an improved insertion loss in the off-state of the LNA. Each of these control loops are enabled or disabled by drain voltage states of the TR element. As explained further below, the circuit configuration that is provided as a bias circuit provides an output signal to the LNA that enables the LNA to be in a high loss state when it is in its "off" state, to help reduce the possibility of the LNA coupling to other components in the system. The output signal provided to the LNA also helps to put the LNA into one of two quiescent bias states, as discussed further herein. In addition, the circuit configuration that is provided as a bias circuit also provides an output signal to the PA to help put the PA into one of two bias states ("on" or "off"), as will be explained further herein.

Figure 5:
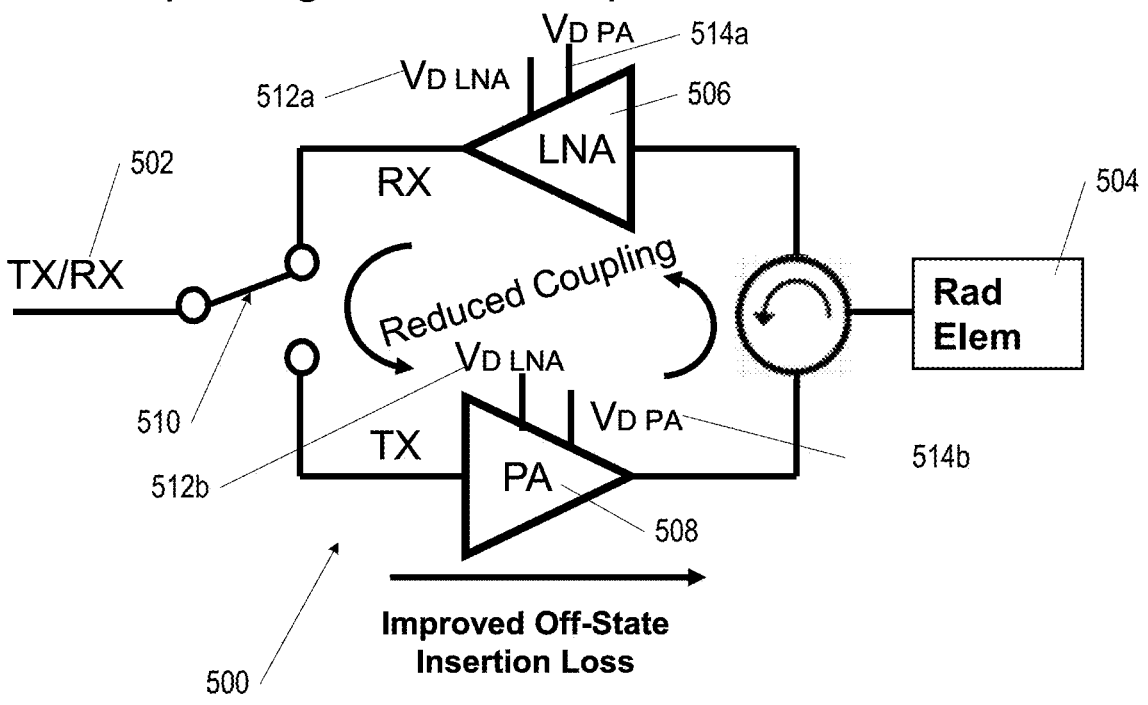
FIG. 5 is a fifth simplified diagram of a circuit representing a second TR front end element when LNA is enabled, in accordance with the RF amplifier bias circuit as described herein, in accordance with one example embodiment of the disclosure.
Figure 6:
FIG. 6 is a truth table showing how the operational state of the circuit of FIG. 5 is related to the bias states of its LNA and of its power amplifier (PA), in accordance with one example embodiment of the disclosure.

For example, FIG. 5 is a fifth simplified diagram of a circuit representing a second TR front end second TR element 500, in a condition where LNA 506 is enabled, which incorporates the RF amplifier bias circuit as described further herein, in accordance with one example embodiment of the disclosure. In FIG. 5, the LNA 506 is illustrated as being enabled and in the "On" state and the PA 508 is in the "off" state. The arrangement of FIG. 5 helps to provide improved off-state amplifier insertion loss. FIG. 6 is a truth table 600 showing how the operational state of the circuit of FIG. 5 is related to the bias states of its LNA 506 and of its PA 508, in accordance with one example embodiment of the disclosure. As FIG. 5 shows, the drain voltage controls (VD) for both the power amplifier (PA) (i.e., VD PA 514a and VD PA 514b) and the drain voltage controls for the low noise amplifier (LNA) (VD LNA 512a and VD LNA 512b) are configured so that each respective amplifier (i.e., PA 508 and LNA 506) each is operably coupled to each both drain voltage control signals. That is, both PA and LNA drain controls go to the LNA and PA in the second TR element 500; they are not separate.

As will be discussed further in connection with FIGS. 7 and 8, the circuit of FIG. 5 uses two differing drain supplies and, advantageously, in at least some embodiments, the drain supply voltages advantageously makes use of two different voltages already present in the system in which the circuit is installed. When necessary, in a given implementation, either or both of the voltages already present in the system may have their levels shifted to levels appropriate to bias the FET amplifiers, as discussed further herein. The power supplies that provide the drain voltages act as both a source of bias and of control logic (sensing signal) for the truth table of FIG. 6. In certain embodiments, the power supplies that supply drain voltage to the LNA 706 of FIG. 7 (i.e., VD LNA 712a) and the PA 708 (i.e., VD PA 714a) also are provided to the bias circuit 703 and are used to toggle between the first and second quiescent bias states, for both the LNA 706 as well as the PA 708. This arrangement enables the control function of the truth table 600 of FIG. 6 to provide an equivalent OR-gate logic function to establish first or second quiescent bias states. That is, the two differing drain supplies help to form the equivalent-OR-gate logic function to establish the first or second quiescent bias states.

Referring to FIGS. 5 and 6, the "off" state, for a given amplifier, is given by the truth table 600, which shows the state that corresponds to when the signals VD LNA 512a, 512b are "high or low, and when the signals VD PA 514a, 514b, are high or low, where "hi," in the truth table 600, corresponds to an "ON" condition and "Lo," in the truth table 600, corresponds to an "off" condition. The PA "off" state is intended to refer to a state when the LNA 506 in "on" and the PA 508 is off (VD PA 514a, VD PA 514b are both "Lo" in FIG. 5 and where VD LNA 512a and VD LNA 512b are both "Hi'), which corresponds to a receive condition for the second TR element 500.

In the receive condition, the TX/RX switch 510 is set to receive path (e.g., as shown in FIG. 5) and signals received at the radiating element(s) 504 are provided to the LNA, which then provides low noise amplification to the signals and provides them to the receiver front end via the TX/RX connection. The receive condition corresponds to a PA "off" state and LNA "on" state" (the first row in the truth table of FIG. 6). In the transmit condition, the TX/RX switch 510 is set to transmit, such that the TX/RX connection 502 is coupled to the PA 508, and signals from a transmitter (not shown) are coupled via the TX/RX connection 502, via the TX/RX switch 510, to PA 508, which provides amplified transmission signals to the radiating element 504. The transmit condition corresponds to the second row of the truth table 600, wherein the first VD LNA signal 512a and the second VD LNA signal 512b are both at a "lo" voltage level, and wherein the first VD PA signal 514a and the second VD PA signal 514b are both "hi" voltage level. Note that, in the truth table 600 of FIG. 6, the "STBY*" state of the third row refers to a standby condition where the radar or the TR front end element is off, such that a high loss condition is not necessary. In the STBY* state, the first VD LNA signal 512a, second VD LNA signal 512b, first VD PA signal 514a and second VD PA signal 514b, are all at "lo" levels. In certain embodiments, the "lo" level in the truth table corresponds to an actual voltage level that is not high enough to turn on the respective amplifier.

Figure 7:
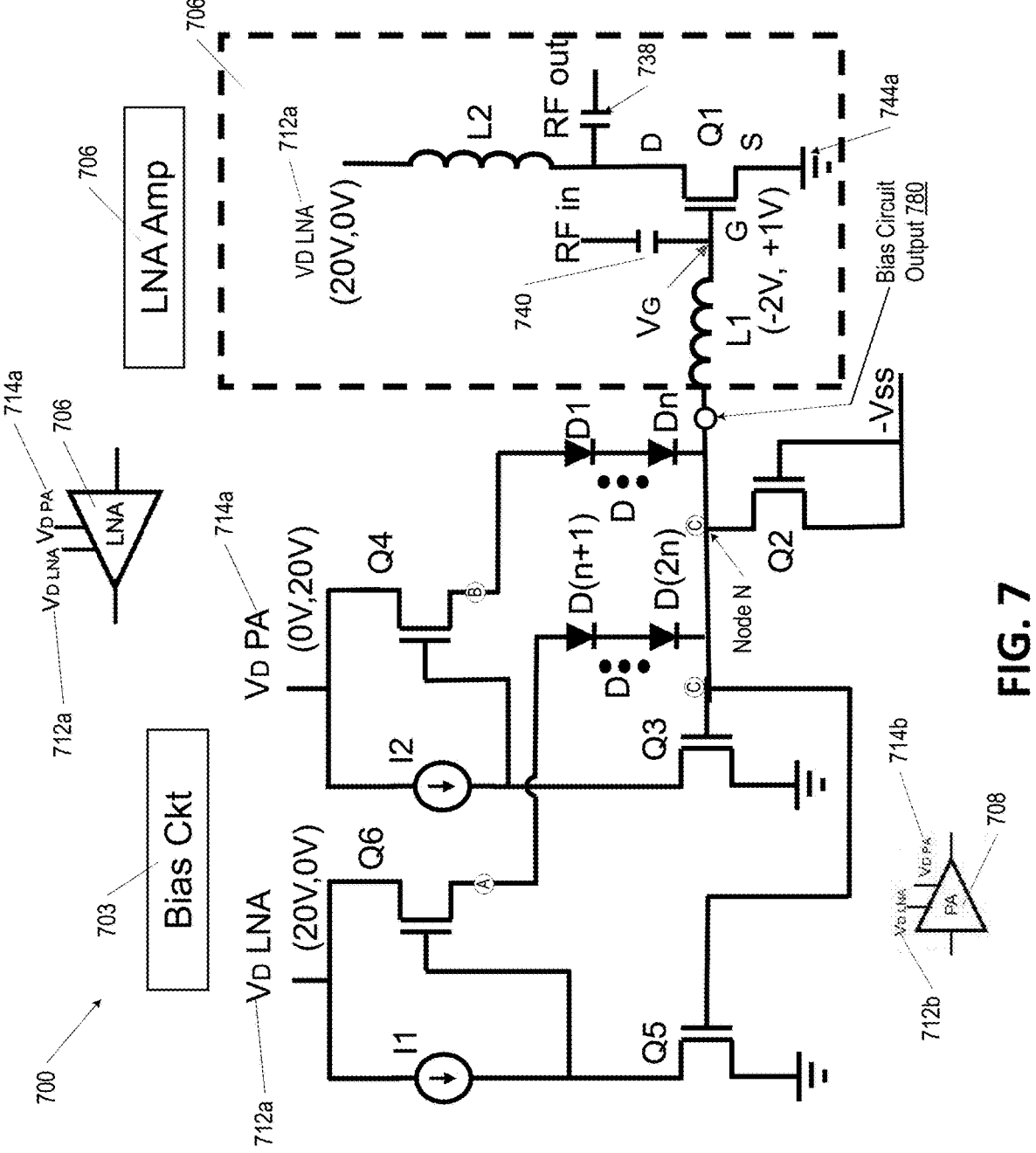
FIG. 7 is a sixth simplified circuit diagram of a first amplifier and first bias circuit, in accordance with a first example embodiment of the disclosure.

FIG. 7 is a sixth simplified circuit diagram 700 of a first amplifier (LNA 706) and first bias circuit 703, in accordance with a first example embodiment of the disclosure. The LNA 706 is similar to the prior art amplifier of FIG. 1; however, its first bias circuit 703 and control of the first bias circuit 703 differs from the prior art discussed herein, because the first bias circuit 703 of FIG. 7 is configured with two control loops: a first control loop configured to be controlled by the drain voltage VD (VD LNA 712a) that is used as the drain voltage of the LNA 706 and a second control loop that is controlled by the same signal (VD PA 714a) that is applied to the drain voltage of the PA 708 (note that details of the PA 708 itself are not shown on FIG. 7, but those of skill in the art will appreciate that in at least some embodiments, the PA 708 can include one or more FET amplifiers controlled by the bias voltage VD PA 714a, each FET amplifier having a drain electrode, a gate electrode, and a source electrode). The control loops and the rest of FIG. 7 are discussed further herein. In certain embodiments, the output signal of the first bias circuit 703 is provided to the gate electrode of Q1 of the LNA 706 of FIG. 7. As shown in FIG. 7, the first control loop includes FETs Q6 and Q5, current source I1, the network of diodes D(n+1) through D(2n) (which together form a first level shifting network), and voltage VD LNA 712a. As shown in FIG. 7, the second control loop includes FETS Q4 and Q3, current source I2, the network of diodes D1 through Dn (which together form a second level shifting network), and voltage VD PA 712a.

Figure 8:
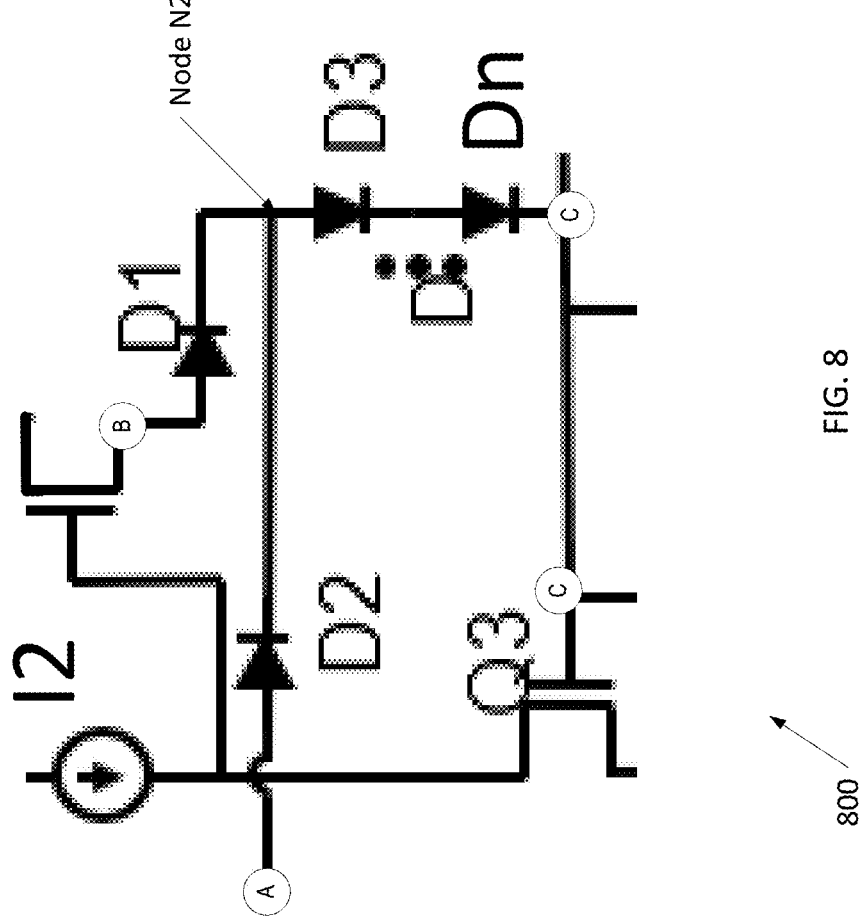
FIG. 8 is a seventh simplified circuit diagram of the diode configuration of second bias circuit, in accordance with a second example embodiment of the disclosure.

In addition, FIG. 8 is a seventh simplified circuit diagram showing an alternate diode configuration, via diode network 800, that replaces the diode arrangement shown between nodes A, B, and C of FIG. 7, in accordance with a second example embodiment of the disclosure. The rest of the bias circuit associated with the circuit diagram of FIG. 8 is generally similar to that of FIG. 7 and operates in a similar way and is not shown here. The differing arrangement of the diode networks in FIG. 8 results in indifferent first and second control loops in FIG. 8 vs FIG. 7. For example, putting the diode network 800 of FIG. 8 to replace the diodes in FIG. 7 connected to nodes A, B, and C, results in a first control loop of FIG. 7 that includes FETs Q6 and Q5, current source I1, and a first level shifting network formed by diode D2 and shared diodes D3 and through Dn, and voltage VD LNA 712a. With the diode network 800 of FIG. 8 replacing the diodes of FIG. 7, the second control loop includes FETS Q4 and Q3, current source I2, and a second level shifting network formed by diode D1 and the shared diodes D3 through Dn and voltage VD PA 712a. Thus, in the following description, because the circuits of FIGS. 7 and 8 operate very similarly; reference is made only FIG. 7. Differences, primarily associated with the diode networks, will be noted.

LNA Operation and Connections

Referring to FIG. 7, in the "on" state, the RF amplifier LNA has the drain VD of Q1 enabled at a positive voltage (e.g., VD LNA 712a of +20V as shown in FIG. 7) for example, and the gate of Q1 has a negative VG potential (e.g., −2V as shown in FIG. 7) providing the proper quiescent bias for RF amplification, i.e. −2.0 V for a d-mode GaN FET such as Q1. In some embodiments, a bias circuit similar to that discussed previously in FIG. 2, can be used to set a proper quiescent gate bias voltage for the LNA 706. However, in accordance with at least some embodiments herein, a different, improved bias circuit, such as first bias circuit 703 of FIG. 7, or the second bias circuit using the diode network 800 of FIG. 8, is provided to not only set a proper quiescent gate bias voltage Vg for the LNA 706, but also to provide two distinct RF conditions of LNA amplification for the LNA 706, as discussed further below.

In the amplifier off-state for LNA 706, the drain voltage VD is set to 0.V In the amplifier off-state, setting the gate voltage VG to a value sufficiently positive relative to process pinch-off voltage, forms a low resistance between the drain and source of Q1, allowing conduction to ground, which increases the insertion loss per gain stage (RF input to RF output) reducing coupling potential to other components integrated into the system architecture. The size of the "low" resistance is relative to the environment in which the circuit is operating. The resistance between the drain electrode and the source electrode, in certain embodiments, is low enough to enable conduction to ground between the drain electrode and the source electrode. This is further explained in the details on the first control loop and second control loop, explained further herein.

To enable the gate voltage Vg for Q1 to be set to a value sufficiently positive relative to process pinch-off voltage, the improved first bias circuit 703 of FIG. 7 and the second bias circuit of FIG. 8 (formed by substituting the diode network 800 of FIG. 8 for the diode network connected at nodes A, B, C in FIG. 7) each provides two control loops. The first control loop corresponds to the "on" state of LNA 706 and is used for setting amplifier quiescent bias when VD LNA 712a quiescent is high (e.g. 20V) and VD PA 714a quiescent is low (e.g. 0V), which per truth table 600 (FIG. 6) corresponds to the Q1 amplifier in LNA "on-state". The second control loop, corresponding to the "off" state of LNA 706, is for setting amplifier quiescent bias when VD LNA 712a quiescent is low (e.g. 0V) and VD PA 714a quiescent is high (e.g. 20V) which corresponds to drain to source conduction to ground for Q1 (i.e. high loss state) in the "off-state" of LNA 706.

Referring briefly to the simplified diagram of FIG. 5 and the truth table of FIG. 6, two VD control voltages (VD LNA 512a and VD PA 514a) are routed to the RF amplifier's LNA 506, and two VD control voltages (VD LNA 512b and VD PA 514b) are routed to the RF amplifier's PA 508. Note that, in certain embodiments, VD LNA 512a and VD PA 514b are at the same voltage value and are intended to be coupled to the same voltage source, e.g., a voltage source in a system in which the LNA and PA are installed. The same applies to VD PA 514a and VD PA 514b. As noted previously, the truth table 600 of VD high/low and VD low/high applied to VD LNA On and VD PA Off, respectively, form the two distinct RF conditions of LNA amplification and LNA high insertion loss based on this embodiment.

Referring again to FIG. 7, the LNA 706 is an RF amplifier that includes a depletion mode (d-mode) transistor Q1 having a source electrode coupled to a reference potential, here ground, and a drain electrode coupled to VD LNA 712a (note that this drain voltage comes from the same supply as (and has the same value as) the voltage signals as VD LNA 712a connected to the bias circuit 703). The drain voltage signal VD LNA 712a also is coupled to PA 708 as VD LNA 712b (again note that PA 708 is not shown in detail in either FIG. 7 or FIG. 8). In addition, the drain voltage signal for PA 708, VD PA 714a, is coupled to the bias circuit 703 as VD PA 714a and is also coupled to the LNA 706. The drain voltage signal for PA 708, VD PA 714b, is also coupled to the PA 708. The drain electrode of Q1 736 is coupled to a potential that is more positive than the reference potential, here (+VD LNA 712a) through a first inductor L2, as shown. The drain electrode of Q1 provides an amplified RF output after passing through a first capacitor 738. The gate electrode of Q1 is coupled to an input signal, here an RF input, through a second capacitor 740, as shown. The source electrode of the transistor Q1 is connected to ground, as shown and there is a second inductor L1 in between drain of Q1 and the gate voltage VG. The gate voltage VG, as shown in FIGS. 7, will vary based on whether the LNA 706 is "on": For example, in certain embodiments, VG is −2V when the LNA 706 is "on" and is −1 V when the LNA 706 is "off" (where on" and "off" are in accordance with the truth table 600 of FIG. 6).

Bias Circuit of FIGS. 7 and 8

As noted previously, the embodiment of FIG. 7 provides a first embodiment of the first bias circuit 703, and FIG. 8 provides a second embodiment of a second bias circuit via the alternate diode arrangement. The two bias circuits operate very similarly and have similar first and second control loops, but have differing diode arrangements, which are discussed further herein. The bias circuits for FIGS. 7 and 8 are each also usable for biasing other circuits besides the LNA 706. For example, in at least some embodiments, the bias circuit 703 is also used for biasing the PA 708. In addition, as discussed further herein in connection with FIGS. 9-10, the bias circuit 703 may be used to bias additional types of LNA amplifiers and many other types of amplifiers, including but not limited to arrangements of cascode amplifiers, such as common source/common gate (CS/CG) configurations.

The bias circuit 703 has two control loops to provide two different possible quiescent bias points for the LNA 706, depending on the value of VD LNA 712a and VD PA 714a. Similarly, although not specifically shown in the figures, the two control loops also provide two different possible quiescent bias points for the PA 708, depending on the value of VD LNA 712b and VD PA 714b. In addition, as discussed further herein, it is possible to have more than two control loops to provide multiple different quiescent bias points for a circuit (including but not limited to an LNA or a PA) that is being biased. Although the figures do not specifically depict arrangements with more than two control loops, those of skill in the art will readily appreciate how such circuits are implemented, based on the Figures and description herein.

In certain embodiments, each bias circuit 703 is making use of existing supply voltages available already in a system and is using those voltages both as control voltages in the truth table 600 as well as voltages used for setting quiescent gate bias voltage. If the existing supply voltages in a system are not at the proper levels to set the quiescent bias voltage, level shifting via networks of diodes can help ensure that the voltage at VG 741 is at the appropriate level. In addition, although not shown herein, in certain embodiments, level shifting also may be accomplished via networks of one or more resistors.

First Control Loop of Bias Circuit 703

The first control loop of bias circuit 703 is used for setting amplifier quiescent bias when VD LNA quiescent is hi (e.g., 20V) and VD PA quiescent is low (e.g., 0 V), which corresponds to Q1 amplifier in the LNA 706 being in the "on" state. When VD LNA 712a is "hi", the TR element 500 (FIG. 5) is in receive mode and TX/RX switch 510 is set to the receive path, and the PA 708 (also, PA 508 in FIG. 5) is turned off, and the LNA 706 (also LNA 506 in FIG. 5) is turned on. In this condition, the first control loop is configured to form a positive, non-inverting current mirror to Q1, but the differing network of diodes between the first bias circuit 703 and second bias circuit of FIG. 8, combine slightly differently and are explained separately, briefly, below.

In the first control loop, the drain electrode of Q5 is fed by current from first current source I1. Although not illustrated in FIG. 7, those of skill in the art will appreciate that a component such as a resistor or another transistor is usable as a constant current source; an example of such a constant current source configuration using a saturated resistor is described in commonly assigned U.S. Pat. No. 8,854,140 (hereinafter "'140 patent"), which is hereby incorporated by reference, but this is not limiting. When VD LNA 712a is at 20V, the first current source I1 operates so that it provides current sufficient to put FET Q5 into saturation, so that its drain to source current (IDS_Q5) is substantially constant with variations in voltage across its source and drain. In addition, in at least some embodiments, the current source may be a linear resistor or an off-chip reference, if needed.

In the first control loop, the gate electrode of FET Q5 is operably coupled to the gate electrode of FET Q3 and to the gate electrode of FET Q1; however, as will be appreciated, per the truth table of FIG. 6, when FET Q5 is in saturation (VD LNA 712a=20 V), the drain of FET Q3 is at 0V, such that FET Q3 is not at its quiescent bias point, because the second current source I2 is providing no current to the drain electrode of Q3. Via the connection from the gate electrode of Q5 to the gate electrode of Q1, the current through the drain electrode of Q5 is at least partially regulated by current I1. The source electrode of Q5 is connected directly to ground, like the source electrode of Q1, which is advantageous for high power and high efficiency RF amplifiers.

The drain electrode of Q5, in the first control loop, is coupled to its gate electrode through two different follower networks: one for the first control loop and one for the second control loop (discussed further below in connection with the discussion of the second control loop). Because the second control loop is not active when Q5 is in saturation, it is not discussed here, but is discussed later. For the first control loop, the first drain follower network comprises FET Q6 and specific diode arrangements (discussed further herein), where the diode arrangements differ between FIG. 7 and FIG. 8.

In the first control loop, the drain electrode of FET Q6 is coupled to VD LNA 712a. The gate electrode of FET Q6 is coupled to the drain electrode of FET Q5 and also is coupled to first current source I1. In FIG. 7, the source electrode of Q6 is coupled to a first end of a first network of diodes D (n+1) through D(2n), which itself is coupled to the gate electrode of Q1 (via L1), to the drain electrode of load Q2, to the gate electrode of Q3, and to the gate electrode of Q5. In FIG. 7, the gate electrode of Q5 also is coupled to a second end of the first network of diodes D(n+1) through D(2n), and also is coupled to a second end of a second network of diodes in the second control loop (i.e., diodes D1 through Dn).

In the first control loop of FIG. 8, the source electrode of Q6 is coupled, at node A, to diode, D2, which itself is coupled to a first end of a third (shared) network of diodes D3 through Dn, to the gate electrode of Q3, to the drain electrode of Q2, to the gate electrode of Q5, and to the gate electrode of Q1 (via L1).

Second Control Loop of Bias Circuit 703

The second control loop of bias circuit 703 is used for setting amplifier quiescent bias when VD LNA 712a is low (e.g., 0V) and VD PA 714a quiescent is high (e.g., 20V), which corresponds to Q1 having a drain to source (D-S) conduction to ground (e.g., high loss state) in the LNA "off" state. When VD PA 714a is "hi", the second TR element 500 (FIG. 5) is in transmit mode and TX/RX switch 510 is set to the transmit path, and the PA 708 (also, PA 508 in FIG. 5) is turned on, and the LNA 706 (also LNA 506 in FIG. 5) is not turned on. In this condition, the second control loop is configured to form a positive, non-inverting current mirror to Q1, but the differing network of diodes between the first bias circuit 703 and the second bias circuit of FIG. 8 combine slightly differently and are explained separately below.

In the first bias circuit 703 of FIG. 7, in the second control loop, the combination of the FET Q3, FET Q4, diodes D1 through Dn, current source I2, FET Q2 and −Vss (which is more negative than ground) forms a positive, non-inverting current mirror to FET Q1. In the second bias circuit of FIG. 8, the second control loop, the combination of the FET Q3, FET Q4, diode D1 and shared network of third diodes D3 through Dn, current source I2, FET Q2, and −Vss (which is more negative than ground) forms a positive, non-inverting current mirror to FET Q1.

For both FIG. 7 and FIG. 8, the drain electrode of Q3 is fed by current from second current source I2. Similar to what was described above in connection with the first current source I1, for the second current source I2, a component such as a resistor or another transistor is usable as a constant current source, e.g., as discussed in the '140 patent, although this is not limiting. When VD PA 714a is at 20V, the second current source I2 operates so that it provides current sufficient to put FET Q3 into saturation, so that its drain to source current (IDS_Q3) is substantially constant with variations in voltage across its source and drain. The gate electrode of FET Q3 is operably coupled to the gate electrode of FET Q5; however, in accordance with the truth table 600 of FIG. 6, when VD PA 714a is at 0V, VD LNA 712a is at 0V, such that FET Q5 is not at its quiescent bias point, because the first current source I1 is providing no current to the drain electrode of Q5.

The gate electrode of FET Q3 is also operably coupled to the gate electrode of Q1, such that the current through the drain electrode of Q3 is at least partially regulated by current I2. The source electrode of Q3 is connected directly to ground, like the source electrode of Q1, which is advantageous for high power and high efficiency RF amplifiers. In addition, the drain electrode of Q3 is coupled to its gate electrode through the two different follower networks, one for the first control loop and one for the second control loop (because the first control loop is not active when Q3 is in saturation, it is not discussed here but is discussed elsewhere).

Use of Diodes in Each Control Loop for Each Bias Circuit

For the first bias circuit 703 of FIG. 7, the diode arrangement for the first control loop includes the first network of diodes, comprising a plurality of serially connected diodes (e.g., D (n+1) through D (2n), where "n" corresponds to the number of second diodes in FIG. 7 discussed further below in connection with the discussion of the second control loop. So, for example, if the second control loop of FIG. 7 has 5 diodes, D1 through D5, such that n=5, the first control loop has diodes D6 through D10 (thus having the same number n of diodes). The number n of second diodes in the network of second diodes is proportional to the voltage required for setting the quiescent bias of Q1.

For the first bias circuit 703 of FIG. 7, in the first control loop of FIG. 7, the first network of diodes D(n+1) through D(2n) helps to provide voltage level shifting and isolation. For example, if there is an issue or unexpected/undesired signal associated with Q5 and/or Q6, the first network of diodes D(n+1) through D(2n) helps to prevent that undesired and/or unexpected signal value from having an undesired impact on Q4 and/or Q3. For the bias circuits of both FIGS. 7 and 8, in certain embodiments, other electrical components, such as resistors, also are usable to help provide voltage level shifting and/or isolation. Furthermore, depending on the application and/or on voltages present in the circuit, one or more of the diodes may be replaced by a short circuit connection.

For the first bias circuit 703 of FIG. 7, in the second control loop, the combination of the FET Q3, FET Q4, second network of diodes D1 through Dn, current source I2, FET Q2 and −Vss (which is more negative than ground) forms a positive, non-inverting current mirror to FET Q1. The second network of diodes D1 through Dn provide level shifting (e.g., from VD LNA 712a to the gate of Q1 and the drain of Q2) as well as isolation. In particular, the network of first diodes D1 through Dn help to provide isolation between the first control loop and the second control loop. For example, if there is any type of an issue or unexpected/undesired signal value associated with elements of the second control loop (e.g., Q4 and/or Q3), the network of first diodes D1 through Dn helps to prevent that unexpected/undesired signal value from having an undesired impact on Q5 and/or Q6.

In the first bias circuit 703 of FIG. 7, for the second control loop, the second drain follower network comprises FET Q4 and a network comprising the aforementioned plurality of serially connected second diodes (e.g., D1 through Dn) and another serial element, here a transistor load Q2 as shown (also discussed further below). The number n of diodes in the second network of diodes is proportional to the voltage required. Thus, in FIG. 7, VD LNA 712a is 0V (such that LNA 706 is "off") and when VD PA is at 20V and the PA 708 is "on," the gate electrode of FET Q3, with the above follower network (e.g., follower Q4, the second network of diodes, and FET Q2) produces an output at the node "N" (e.g., approximately +1V), which is fed to the gate electrode of d-mode FET Q1. In accordance with the second control loop of FIG. 7, because VD LNA 712a is at 0V and VD PA 714a is at a positive voltage (e.g., 20V) and the gate electrode of Q1 has a positive potential (e.g., +1V), Q1 has the proper quiescent bias for second condition of LNA 706 high insertion loss, wherein there is Q1 drain to source conduction to ground in the LNA 706 "off" state.

The bias circuit formed using the alternate diode arrangement of FIG. 8 also provides level shifting and isolation via its diode networks but does so in a different diode configuration. In FIG. 8, the first control loop and the second control loop each have their own respective diode for level shifting and isolation (e.g., diode D2 for the first control loop and diode D1 for the second control loop), and the first control loop and second control loop are each coupled to the shared third network of diodes. For FIG. 8, the diode arrangement for its first control loop includes the diode D2 and the shared third network of diodes D3 through Dn, where the number "n" of third diodes D3 is proportional to the voltage required for setting the quiescent bias of Q1 836. In at least some embodiments, in either the second bias circuit of FIG. 8 or the first bias circuit 703, depending on the application and voltages present in the circuit, one or more diodes may be replaced by short-circuits or by resistors.

In FIG. 8, in the second control loop, the second drain follower network comprises FET Q4 and a network comprising the diode D1 and the aforementioned shared third network of diodes (e.g., D1 through Dn) and another serial element, here a transistor load Q2 as shown. As noted previously, the number n of diodes in the shared third network of diodes is proportional to the voltage required. Thus, using the diode arrangement of FIG. 8, when VD LNA 712a is 0V (such that LNA 706 is "off") and when VD PA is at 20V and the PA 708 is "on," the gate electrode of FET Q3, with the above follower network (e.g., follower Q4, the diode D1, the shared network of third diodes D3 through Dn, and FET Q2) produces an output at the node N (e.g., approximately +1V), which is fed to the gate electrode of d-mode FET Q1.

In accordance with the second control loop in FIG. 8, because VD LNA 712a is at 0V and VD PA 714a is at a positive voltage (e.g., 20V) and the gate electrode of Q1 has a positive potential (e.g., +1V), Q1 has the proper quiescent bias for second condition of LNA 706 high insertion loss, wherein there is Q1 drain to source conduction to ground in the LNA "off" state. In addition, in FIG. 8, the first control loop and the second control loop each are coupled to node N2, which connects to a first end of the third shared network of diodes D3 through Dn, which are coupled to node C, which then couples to the gate of Q1 of the LNA 706, through inductor L1.

In the second bias circuit formed using the diode network of FIG. 8, the diodes D2 and D1 help to provide isolation between the first control loop and the second control loop. For example, if there is any type of an issue or unexpected/undesired signal value associated with Q4 and/or D1, the diode D2 helps to prevent that unexpected signal value from having an undesired impact on Q5 and/or Q6. Similarly, if there is an issue or unexpected/undesired signal associated with Q6 and/or D2, the diode D1 helps to prevent that unexpected signal value from having an undesired impact on Q4 and/or Q3. Thus, the diodes D1 and D2 of FIG. 8 help to provide isolation between the first control loop and the second control loop Referring still FIG. 8, in the second control loop, the combination of Q3, Q4, and a corresponding network of diodes formed by D1 and then the shared network of third diodes D3 through Dn, current source I2, Q2 and −Vss (which is more negative than ground) forms a positive, non-inverting current mirror to Q1. The diode D1 that is dedicated solely to the second control loop of FIG. 8 (and is not shared with first control loop) is used for level shifting that is unique to and/or specific to the second control loop and also is used for helping with isolation, as noted above with the bias circuit 703 of FIG. 7. In certain embodiments, one or more of the diodes shown in FIGS. 7 and 8 could be replaced by resistors. In certain embodiments, depending on the application and on voltages in the circuit, any one or more of the diodes may be replaced by a short circuit. The level shifting that is unique to and/or specific to the second control loop can, for example, be related to shifting the levels of VD PA 714*a* to ensure operation of the second bias circuit of FIG. 8 and/or the LNA 706 in accordance with the truth table 600 of FIG. 6. For example, in a given system environment, it is possible that the VD PA 714*a* might have levels of "high" and "low" that are slightly too high for proper operation of the LNA amp 706 and/or PA 708, and the diode D1 of FIG. 8 may be configured to provide a voltage level shifting (e.g., a voltage drop) that can help ensure proper operation.

Transistor Load for Both First and Second Control Loops

For both FIG. 7 and FIG. 8, the first control loop and the second control loop are each also coupled to another serial element, here a transistor load Q2 as shown. When VD LNA 712*a* is 20V (such that LNA 706 is "on") and when VD PA is at 0V (such that the PA 708 is "off"), the gate electrode of FET Q5, with the above follower network (i.e., follower Q6, and the corresponding diodes for the second control loop) produces an output at the node N of approximately −2V, which is fed to the gate electrode of d-mode FET Q1. In accordance with the first control loop, because VD LNA 712*a* is at a positive voltage (e.g., 20V) and the gate electrode of Q1 has a negative potential (e.g., −2V), Q1 has the proper quiescent bias for a first condition of LNA amplification, e.g., −2V for a d-mode GaN FET such as Q1.

Output of Bias Network and Insertion Loss

In both of the bias networks of the example embodiments of FIG. 7 and FIG. 8, the output at node N is approximately +1V. However, because VD LNA 712*a*, as provided to drain electrode of Q1, is 0V in this state, the voltage at the gate electrode of Q1 is sufficiently positive relative to the process pinch-off voltage (e.g., −2.5V) and forms a low resistance between the drain and source of Q1, allowing conduction to ground, which increases the insertion loss per gain stage (RF input to RF output), reducing coupling potential to other components integrated into the system architecture. When the VGS voltage is sufficiently negative relative to the pinch-off voltage, the FET Q1 allows virtually zero IDS current. This state creates a much greater resistance D-S which in itself doesn't support a high loss condition.

Thus, as the aforementioned description explains, the first bias circuit 703 of FIG. 7 and the second bias circuit using the alternate diode network 800 of FIG. 8 each provides a first quiescent bias for on-state of the LNA 706, via first control loop, and a second quiescent bias establishing an improved insertion loss in the off-state of the LNA 706, via second control loop. The first control loop and second control loop are thus enabled by the state of the drain voltage (VD LNA 712*a*, VD PA 714*a*) of the second TR element 500.

Although the configuration of FIGS. 5-8 above was described in connection with GaN applications, one of skill in the art will appreciate that the embodiments also have applicability in Gallium Arsenide (GaAs) applications, as well as many other semiconductor technologies, including but not limited to Silicon (Si), Silicon Carbide (SiC), Germanium (Ge), Silicon Germanium (SiGe), Indium Phosphide (InP), Boron Nitride (BN), Aluminium Nitride (AlN), Gallium Phosphide (GaP), Cadmium Sulphide (CdS), Lead Sulphide (PbS), piezoelectric materials, etc. In addition the FETs are here described as MOS devices. Further, although the circuits of FIGS. 5-8 have been described using depletion mode GAN FETs, those of skill in the art will appreciate that all of part of the circuits of FIGS. 5-8 may be modified to operate using enhancement mode FETs.

In addition, although not specifically illustrated in the figures, those of skill in the art will appreciate that the bias circuits of FIGS. 7 and 8 each could be configured with more than the illustrated two control loops, such that the truth table 600 of FIG. 6 could reflect controls of the state of the circuit based on other voltages present within a given system, in addition to the voltages VD LNA 512*a* and VD PA 514*a*. For example, the bias circuits of FIGS. 7 and 8 each also can be modified, in some embodiments, to provide several different "first" and/or "second" control loops to control a system each could be in one of three or more states, such that any one or more of the four circuit elements (e.g., amplifiers, but this is not limiting) could be "on" or "off" depending on the four or more control voltages. For example, in certain embodiments there are a plurality of voltage input loops (control loops based on voltage inputs to the amplifiers of a system). That is, there can be more than two control loops, in at least some embodiments, as noted herein.

The bias circuits of FIGS. 7 and 8 may be adapted, in certain embodiments, to work with a range of input voltages that are different from the illustrated "hi" and "lo" conditions in the truth table of FIG. 6. For example, for a system that is not a radar front end element that could be in "transmit" or "receive" states, the system may have a range of input voltages that are all configured to turn a given amplifier "on" or "off," based on the output of the bias circuits of FIGS. 7 and 8.

Figure 9:
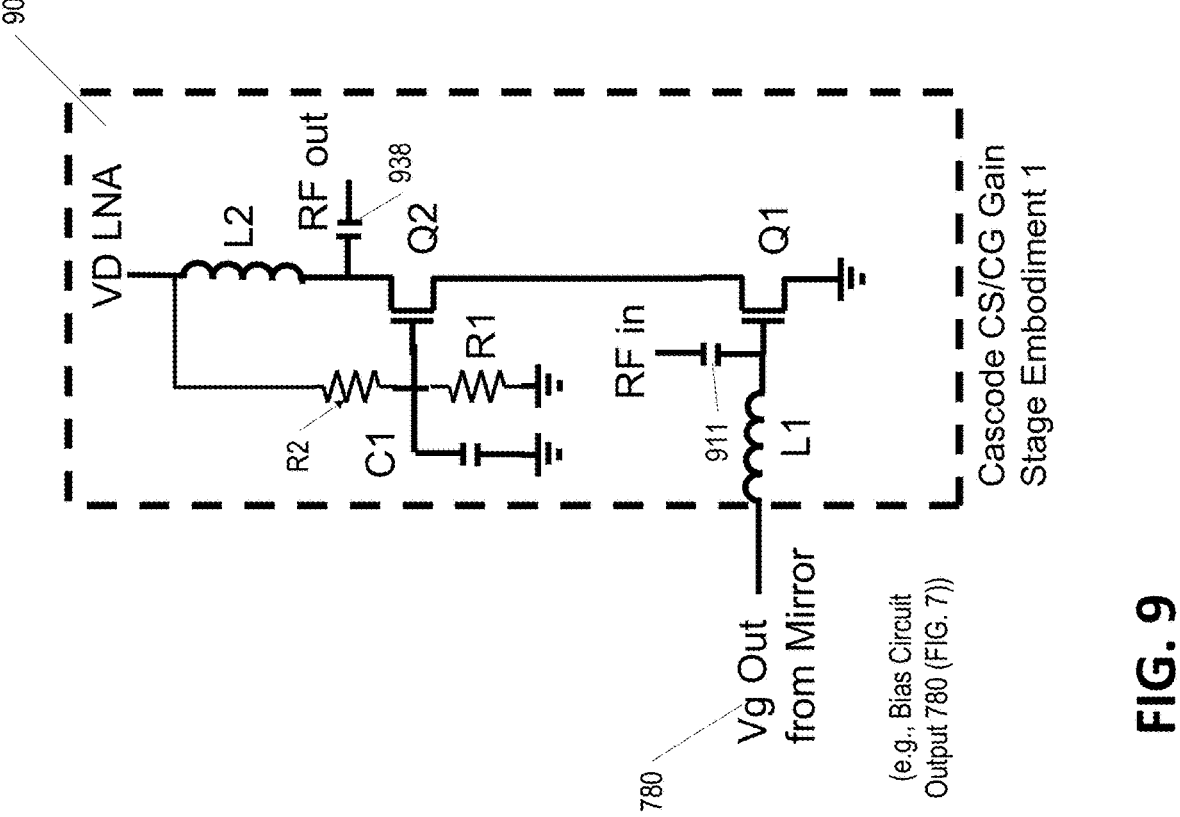
FIG. 9 is an eighth simplified circuit diagram of a first alternate amplifier usable with the exemplary bias circuits of FIGS. 5-8, in accordance with one embodiment.

In addition, as noted previously, the bias circuits of FIGS. 7 and 8 are usable to bias many other types of circuits and amplifiers. For example, FIG. 9 is an eighth simplified circuit diagram 900 of a first alternate amplifier 907 usable with the exemplary bias circuits, block diagrams, and truth table of FIGS. 5-8, in accordance with one embodiment. The first alternate amplifier 907 is a cascode common source/common gate (CS/CG) gain stage, which can receive Vg out 780 from the current mirror of the bias circuit 703

The first alternate amplifier 907 includes a pair of FETs, such as CS FET Q1 and CG FET Q2, which are advantageously of equal gate widths, which are arranged as a cascode amplifier. Q1 and Q2 are serially connected between a first voltage source, VD LNA, and ground potential. An input RF signal RF in is fed to the gate of CS FET,(Q1) through a first direct current (DC) blocking capacitor 911, for amplification by the amplifier 907, to produce an output RF signal RF out at the drain of CG FET Q2, which output is fed through a second DC blocking capacitor 938, as shown in FIG. 9. Capacitor C1 is a bypass capacitor connected to the gate electrode of Q2. A first inductor L1 which is connected to the gate electrode of Q1 and a second inductor L2 connected to the drain electrode of Q2 allow for DC connection between the Vg out 780 (bias input) on one side and transistor Q on the other while preventing an RF connection. Resistors R2 and R1 form a voltage divider network to the gate electrode of Q2.

Figure 10:
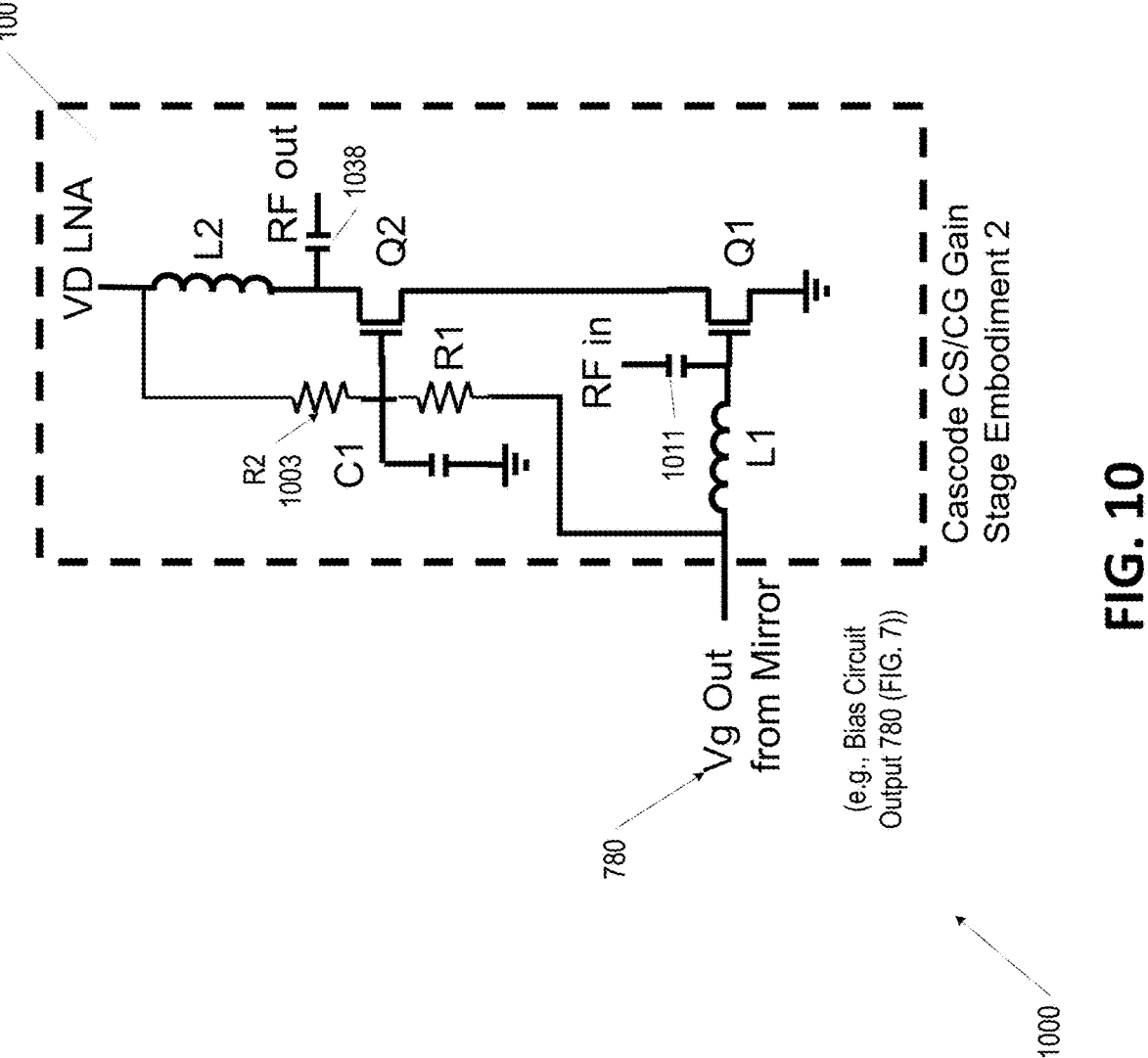
FIG. 10 is a ninth simplified circuit diagram of a second alternate amplifier usable with the exemplary bias circuits of FIGS. 5-8, in accordance with one embodiment.

FIG. 10 is a simplified circuit diagram 1000 of a second alternate amplifier 1007 usable with the exemplary bias circuits, block diagrams and truth table of FIGS. 5-8, in accordance with one embodiment. The second alternate amplifier 1007 is similar to the first alternate amplifier 907, described above, except that in the second alternate amplifier 1007, instead of the resistors R1 and R2 of FIG. 9, which form a voltage divider network, the resistors R2 and R1 form a so-called "Millman Passive Averager" circuit, which is more fully described in commonly assigned U.S. Pat. No. 9,520,836, entitled, "Multistage Amplifier with Cascode Stage and DC Bias Regulators," which is hereby incorporated by reference. Accordingly, in FIG. 10, resistor R1 is connected in between the gate of Q2 and one side of inductor L1, instead of to ground, as is done for R1 of FIG. 9. The rest of the circuit of FIG. 10 is identical to that of FIG. 9.

The embodiments herein can be combined with the disclosures in one or more of the following U.S. patents, patent publications, and pending patent applications, some of which are commonly assigned, all of which are all hereby incorporated by reference: U.S. Pat. No. 4,896,121, entitled, "Current Mirror For Depletion-mode Field Effect Transistor Technology," issued on Jan. 23, 1990; U.S. Pat. No. 5,793,194, entitled, "Bias Circuit Having Process Variation Compensation And Power Supply Variation Compensation," issued on Aug. 11, 1998; U.S. Pat. No. 5,889,429, entitled. "Semiconductor Integrated Circuit And Semiconductor Integrated Circuit Device," issued on Mar. 30, 1999; U.S. Pat. No. 6,114,901, entitled, "Bias Stabilization Circuit" and issued on Sep. 5, 2000; U.S. Pat. No. 6,304,130, entitled. "Bias Circuit For Depletion Mode Field-effect Transistors," issued on Oct. 16, 2001; U.S. Pat. No. 7,852,136, entitled, "Bias Network," issued on Dec. 14, 2010; U.S. Pat. No. 7,928,804, entitled, "Power amplifier," issued on Apr. 19, 2011; U.S. Pat. No. 8,854,140, entitled, "Current Mirror With Saturated Semiconductor Resistor," issued on Oct. 7, 2014; U.S. Pat. No. 9,520,836, entitled, "Multi-Stage Amplifier with Cascode Stage and DC Bias Regulator," issued on Dec. 13, 2016; U.S. Pat. No. 9,584,072, entitled, "DC Bias Regulator for Cascode Amplifier," issued on Feb. 28, 2017; U.S. Pat. No. 9,634,613, entitled, "Bias Circuit Having Reduced Power Consumption," issued on Apr. 25, 2017; U.S. Pat. No. 9,960,740, entitled "Bias Circuitry for Depletion Mode Amplifiers," issued on May 1, 2018; U.S. Pat. No. 10,277,176, entitled, "Bias Circuitry for Depletion Mode Amplifiers," issued on Apr. 30, 2019; U.S. Pat. No. 10,447,208, entitled, "Amplifier Having a Switchable Current Bias Circuit," issued on Oct. 25, 2019; U.S. Pat. No. 11,476,154, entitled, "Field Effect Transistor Having Improved Gate Structures," issued on Oct. 18, 2022, as well as the U.S. Patent Publication No. 20070125414, entitled, "Thermoelectric Bias Voltage Generator," published on Jun. 17, 2007, and also U.S. patent application Ser. No. 17/646,162, entitled, "Amplifier Bias Circuit," filed on Dec. 28, 2021.

The terms "comprises," "comprising", "includes", "including", "having" and their conjugates at least mean "including but not limited to". As used herein, the singular form "a," "an" and "the" includes plural references unless the context clearly dictates otherwise. Various elements, which are described in the context of a single embodiment, may also be provided separately or in any suitable subcombination. Various changes in the details, materials, and arrangements of the parts that have been described and illustrated herein may be made by those skilled in the art without departing from the scope of the following claims.

The embodiments described herein are not limited to the specific terminology so selected, and each specific term at least includes all grammatical, literal, scientific, technical, and functional equivalents, as well as anything else that operates in a similar manner to accomplish a similar purpose. Furthermore, in the illustrations, Figures, and text, specific names may be given to specific features, elements, circuits, modules, etc. Such terminology used herein, however, is for the purpose of description and not limitation.

Although the embodiments included herein have been described and pictured in an advantageous form with a certain degree of particularity, it is understood that the present disclosure has been made only by way of example, and that numerous changes in the details of construction and combination and arrangement of parts may be made without departing from the spirit and scope of the described embodiments. The technology and embodiments disclosed herein can be used in combination with other technologies. In addition, all publications and references cited herein are expressly incorporated herein by reference in their entirety. Individual elements of different embodiments described herein may be combined to form other embodiments not specifically set forth above. Various elements, which are described in the context of a single embodiment, may also be provided separately or in any suitable sub-combination. It should also be appreciated that other embodiments not specifically described herein are also within the scope of the following claims.

What is claimed is:

1. A circuit, comprising:
a first amplifier comprising a first output transistor, the first output transistor comprising a first source electrode, a first drain electrode, and a first gate electrode; and
a bias circuit in operable communication with the first amplifier, the bias circuit comprising:
a first control loop configured to set a first quiescent bias for the first output transistor based on a first value of a first control voltage and a second value of a second control voltage, wherein the first quiescent bias is configured to put the first output transistor in an "on" state;
a second control loop configured to set a second quiescent bias for the first output transistor based on the first value of the first control voltage and the second value of the second control voltage, wherein the second quiescent bias is configured to put the first output transistor in an "off" state and to increase an insertion loss of the first amplifier when the first output transistor is in the "off" state; and
a first level shifting network having a first terminal coupled to a node common to the first control loop and the second control loop and a second control terminal coupled to the first gate electrode, the first level shifting network being shared by the first control loop and the second control loop and configured to level shift a signal provided to the first gate electrode.

2. The circuit of claim 1, wherein the bias circuit is configured to provide a first output signal to the first gate electrode, the first output signal based on at least one of the first control loop and the second control loop.

3. The circuit of claim 2, wherein at least one of the first control loop and the second control loop further comprises a second level shifting network configured to provide a second level shifting in a level of the first output signal.

4. The circuit of claim 3, wherein the second level shifting network comprises at least one of a diode, a resistor, and a short circuit connection.

5. The circuit of claim 1, wherein:
the first control loop and the second control loop are each coupled to a node that is coupled to a first end of the first level shifting network; and
a second end of the first level shifting network is coupled to the first gate electrode of the first amplifier.

6. The circuit of claim 1, wherein the first level shifting network comprises at least one of a diode, a resistor, and a short circuit connection.

7. The circuit of claim 1, wherein the second quiescent bias is configured to:
set a voltage at the first gate electrode to a value that is positive relative to a pinch-off voltage of the first output transistor; and
form a resistance between the first drain electrode and the first source electrode that is low enough to enable conduction to ground between the first drain electrode and the first source electrode.

8. The circuit of claim 1, wherein one of the first and second control voltages is coupled to the first drain electrode of the first amplifier.

9. The circuit of claim 1, wherein, if the first control voltage is at a logic high level and the second control voltage is at a logic low level, the first control loop is configured to set the first quiescent bias to put the first output transistor in the "on" state.

10. The circuit of claim 1, wherein, if the first control voltage is at a logic low level and the second control voltage is at a logic high level, the second control loop is configured to set the second quiescent bias to put the first output transistor in the "off" state.

11. The circuit of claim 1, wherein at least one of the first control loop and the second control loop further comprises a diode network comprising at least one diode, wherein the diode network is configured to isolate at least a portion of the first control loop from the second control loop.

12. The circuit of claim 1, further comprising a second amplifier comprising a second output transistor, the second output transistor comprising a second source electrode, a second drain electrode, and a second gate electrode, wherein:
the bias circuit is in operable communication with the second amplifier;
the first control loop is configured to set a third quiescent bias for the second output transistor based on the first value of the first control voltage and the second value of the second control voltage, wherein the third quiescent bias is configured to put the second output transistor in an "off" state and to increase an insertion loss of the second amplifier when the second output transistor is in the "off" state; and
the second control loop is configured to set a fourth quiescent bias for the second output transistor based on the first value of the first control voltage and the second value of the second control voltage, wherein the fourth quiescent bias is configured to put the second output transistor in an "on" state.

13. The circuit of claim 12, wherein the first control loop and the second control loop are configured so that, if the first control voltage is at a logic high level and the second control voltage is at a logic low level, the first control loop sets the first quiescent bias to put the first output transistor in the "on" state and sets the third quiescent bias to put the second output transistor in the "off" state.

14. The circuit of claim 12, wherein the first control loop and the second control loop are configured so that, if the first control voltage is at a logic low level and the second control voltage is at a logic high level, the second control loop sets the first quiescent bias to put the first output transistor in the "off" state and sets the fourth quiescent bias to put the second output transistor in the "on" state.

15. The circuit of claim 12, wherein the bias circuit is configured to provide a second output signal to the second gate electrode, the second output signal based on at least one of the first control loop and the second control loop.

16. The circuit of claim 1, wherein the first output transistor is a depletion mode transistor.

17. The circuit of claim 1, wherein at least one of the first control loop and the second control loop comprises a plurality of control loops.

18. The circuit of claim 1, wherein at least one of the first control voltage and the second control voltage is associated with a range of voltage values.

19. A method, comprising:
providing a first amplifier comprising a first output transistor, the first output transistor comprising a first source electrode, a first drain electrode, and a first gate electrode;
operably coupling a bias circuit to the first amplifier, the bias circuit comprising:
a first control loop configured to set a first quiescent bias for the first output transistor based on a first value of a first control voltage and a second value of a second control voltage, wherein the first quiescent bias is configured to put the first output transistor in an "on" state;
a second control loop configured to set a second quiescent bias for the first output transistor based on the first value of the first control voltage and the second value of the second control voltage, wherein the second quiescent bias is configured to put the first output transistor in an "off" state and to increase an insertion loss of the first amplifier when the first output transistor is in the "off" state; and
a level shifting network configured to be shared by the first control loop and the second control loop; and
providing a first output signal to the first gate electrode, the first output signal based on at least one of the first control loop and the second control loop and level shifted by the level shifting network.

20. The method of claim 19, further comprising:
setting a voltage at the first gate electrode to a value that is positive relative to a pinch-off voltage of the first output transistor; and
forming a resistance between the first drain electrode and the first source electrode that is low enough to enable conduction to ground between the first drain electrode and the first source electrode.

* * * * *